United States Patent
Lee et al.

(10) Patent No.: US 12,029,099 B2
(45) Date of Patent: Jul. 2, 2024

(54) SYSTEM AND METHOD FOR MANUFACTURING OPTICAL DISPLAY ELEMENT

(71) Applicant: LG CHEM, LTD., Seoul (KR)

(72) Inventors: Beom Seok Lee, Daejeon (KR); Chan Soo Kim, Daejeon (KR); Eung Jin Jang, Daejeon (KR); Sung Hyun Baek, Daejeon (KR); Yu Jin Lim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 780 days.

(21) Appl. No.: 15/734,072

(22) PCT Filed: Jun. 28, 2019

(86) PCT No.: PCT/KR2019/007885
§ 371 (c)(1),
(2) Date: Dec. 1, 2020

(87) PCT Pub. No.: WO2020/013490
PCT Pub. Date: Jan. 16, 2020

(65) Prior Publication Data
US 2021/0226176 A1  Jul. 22, 2021

(30) Foreign Application Priority Data

Jul. 9, 2018 (KR) .................. 10-2018-0079536

(51) Int. Cl.
*H10K 71/00* (2023.01)
*B29C 55/02* (2006.01)
(Continued)

(52) U.S. Cl.
CPC .......... *H10K 71/00* (2023.02); *B29C 55/026* (2013.01); *B29C 65/7459* (2013.01); *G02B 5/30* (2013.01); *H10K 50/85* (2023.02)

(58) Field of Classification Search
CPC .............. B32B 38/04; B32B 2038/045; B32B 2457/20; B32B 2457/202; G02F 1/1303;
(Continued)

(56) References Cited

U.S. PATENT DOCUMENTS

2009/0263608 A1* 10/2009 Kitada .................. G02F 1/1303
156/263
2013/0028558 A1  1/2013 Jenkins
(Continued)

FOREIGN PATENT DOCUMENTS

CN    101819346 A    9/2010
JP      4307510 B1   8/2009
(Continued)

*Primary Examiner* — John L Goff, II
(74) *Attorney, Agent, or Firm* — Bryan Cave Leighton Paisner LLP (57) ABSTRACT

A system for manufacturing an optical display element by laminating an optical film on one surface of a rectangular organic light emitting display panel, the system including: a panel supply unit to which an organic light emitting display panel is supplied; a panel conveying unit which conveys the supplied organic light emitting display panel; an optical film supply unit which supplies an optical film by unwinding the optical film from a raw optical film roll; a laminating unit which laminates the optical film on one surface of the organic light emitting display panel; and a turning unit which rotates the organic light emitting display panel by 90° before the optical film is laminated on one surface of the organic light emitting display panel when a width-directional edge of the supplied organic light emitting display panel does not correspond to a width of the raw optical film roll.

5 Claims, 5 Drawing Sheets

(51) Int. Cl.
  *B29C 65/74* (2006.01)
  *G02B 5/30* (2006.01)
  *H10K 50/85* (2023.01)

(58) Field of Classification Search
  CPC ............. G02F 1/1333; G02F 1/133528; Y10T
       156/1067; Y10T 156/1069; H10K 71/00;
       H10K 50/85; B29C 65/7459; G02B 5/30
  USPC .............................................. 156/259; 83/44
  See application file for complete search history.

(56) References Cited

U.S. PATENT DOCUMENTS

2017/0341362 A1* 11/2017 Lee ................... G02F 1/133528
2017/0343838 A1   11/2017 Lee et al.

FOREIGN PATENT DOCUMENTS

| JP | 2009276755 A   | 11/2009 |
| JP | 2010-113357 A  | 5/2010  |
| JP | 2012-063707 A  | 3/2012  |
| JP | 2012-247582 A  | 12/2012 |
| JP | 2017-032739 A  | 2/2017  |
| KR | 10-2007-0037152 A | 4/2007 |
| KR | 10-1674352 B   | 11/2016 |
| KR | 10-1674354 B   | 11/2016 |
| KR | 10-2017-0021622 A | 2/2017 |
| KR | 10-2017-0092355 A | 8/2017 |
| KR | 20170092355 A  | 8/2017  |
| TW | 201213929 A1   | 4/2012  |
| TW | 201343399 A    | 11/2013 |

\* cited by examiner

SYSTEM AND METHOD FOR MANUFACTURING OPTICAL DISPLAY ELEMENT

CROSS-REFERENCE TO RELATED APPLICATIONS

This application is a U.S. national stage of international Application No. PCT/KR2019/007885 filed Jun. 28, 2019, and claims priority from Korean Patent Application No. 10-2018-0079536 filed Jul. 9, 2018, the contents of which are incorporated as if fully set forth herein.

FIELD

The present invention relates to a system and a method for manufacturing an optical display element by laminating an optical film on one surface of a rectangular organic light emitting display panel.

BACKGROUND

A rectangular optical display element may be manufactured by attaching an optical film to a display panel. A method, which unwinds the optical film from a raw optical film roll and then supplies and attaches the optical film, is more advantageous in process speed and efficiency than a method that individually supplies a sheet piece separately formed to have a size corresponding to a size of the display panel.

Currently, the most universally used optical display element is a liquid crystal optical display element manufactured by attaching optical films, each including a polarizing plate, to both surfaces of a liquid crystal panel. The liquid crystal optical display element has a light source provided on a light source side surface of the liquid crystal panel, such that an image may be displayed as light emitted from the light source passes through the light source side surface, a liquid crystal layer, and a visible side surface of the liquid crystal panel. In addition, in the liquid crystal optical display element, transmission axes of the polarizing plates attached to both surfaces of the liquid crystal panel are disposed to be perpendicular to each other to implement a dark state.

Meanwhile, an organic light emitting optical display element, which is gradually and increasingly being used, is provided with an organic light emitting display panel without a separate light source and requires no polarizing plate for implementing a dark state because an organic light emitting layer of the organic light emitting display panel may serve as a light source.

Figure 1:
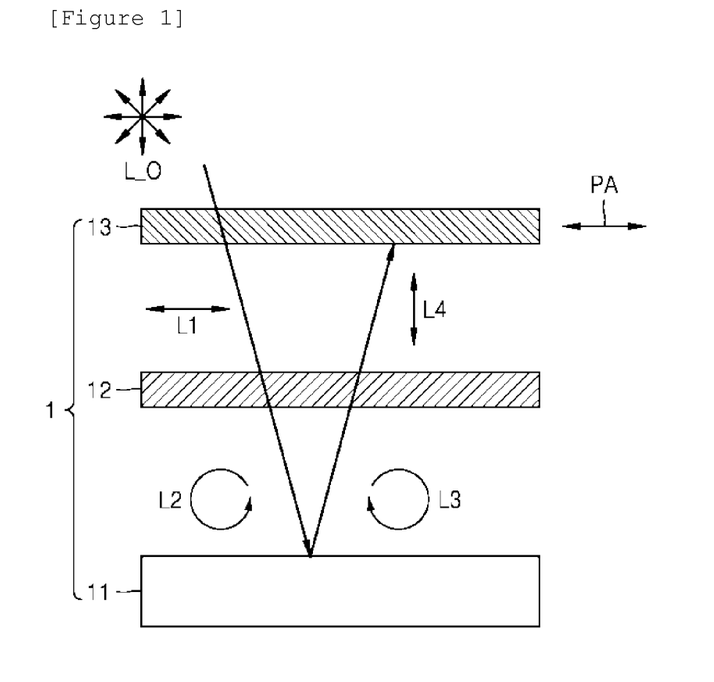
FIG. 1 is a schematic illustration of a structure of an organic light emitting optical display element and a propagation route of external light.

However, as illustrated in FIG. 1, an organic light emitting optical display element 1 may include a quarter-wave plate (QWP) 12 disposed on an organic light emitting display panel 11, and a polarizing plate 13 disposed on the quarter-wave plate 12, to prevent external light L_O incident from the outside from being reflected to the outside and being visually recognized.

Hereinafter, the principle that the polarizing plate 13 and the quarter-wave plate 12 prevent the external light L_O incident on the organic light emitting optical display element 1 from being visually recognized outside the device will be described.

The external light L_O incident on the organic light emitting optical display element 1 may have mixed light beams that vibrate in all directions perpendicular to the propagation direction of the external light L_O.

When the external light L_O is incident on the polarizing plate 13, the polarizing plate 13 transmits only the light that vibrates in a direction identical to a transmission axis direction PA of the polarizing plate 13, that is, the polarizing plate 13 transmits first linearly polarized light L1.

The first linearly polarized light L1 transmitted by the polarizing plate 13 is incident on the quarter-wave plate 12. As illustrated in FIG. 1, when the first linearly polarized light L1 is incident on the quarter-wave plate 12, first circularly polarized light L2 is made and transmitted by the quarter-wave plate 12. The first circularly polarized light L2 may be right circularly polarized light or left circularly polarized light, and FIG. 1 illustrates the left circularly polarized light.

The first circularly polarized light L2 transmitted by the quarter-wave plate 12 is incident on the organic light emitting display panel 11. As illustrated in FIG. 1, when the first circularly polarized light L2 is incident on the organic light emitting display panel 11, the first circularly polarized light L2 is reflected by a surface of the organic light emitting display panel 11 such that second circularly polarized light L3 is made in a direction opposite to the direction of the incident first circularly polarized light L2. As further illustrated in FIG. 1, the left circularly polarized light is incident on the surface of the organic light emitting display panel 11 and reflected, and the second circularly polarized light L3 made by the reflection is the right circularly polarized light.

The second circularly polarized light L3 reflected by the surface of the organic light emitting display panel 11 is incident on the quarter-wave plate 12. As illustrated in FIG. 1, when the second circularly polarized light L3 is incident on the quarter-wave plate 12, second linearly polarized light L4 is made and transmitted by the quarter-wave plate 12.

The second linearly polarized light L4 vibrates in a direction perpendicular to the transmission axis direction PA (identical to the vibration direction of the first linearly polarized light L1) of the polarizing plate 13. When the second linearly polarized light L4 is incident on the polarizing plate 13, the polarizing plate 13 cannot transmit the second linearly polarized light L4 because the second linearly polarized light L4 vibrates in the direction perpendicular to the transmission axis direction PA of the polarizing plate 13 such that the second linearly polarized light L4 is intactly absorbed into the polarizing plate 13.

Therefore, in some instances, an optical film including a polarizing plate having a transmission axis in one direction may also be provided on the organic light emitting optical display element.

Meanwhile, in a system for manufacturing an optical display element by laminating an optical film on a display panel, a direction in which the optical film is cut, a direction in which a means for laminating the optical film, such as a roller, extends, and a direction in which an image capturing device for optically inspecting the optical film and/or the display panel is arranged are in parallel with a width direction of the optical film and/or the display panel.

In this case, in terms of a reduction in costs for establishing equipment and stability of processes, it is advantageous to reduce an extension length of the means for laminating the optical film and an arrangement length of the image capturing device. Therefore, in the system for manufacturing an optical display element, the display panel is generally supplied in a state in which a short edge of the display panel is set to a width direction.

Therefore, a raw optical film roll used for the system for manufacturing an optical display element is generally provided as a short edge width roll by slitting a raw optical film, which has a larger width before processing than the raw optical film roll, by a width corresponding to a short edge width of the display panel.

A length of a short edge and a length of a long edge of the display panel may vary depending on a size of an optical display element to be manufactured. When the raw optical film roll is provided only as the short edge width roll by slitting the raw optical film before processing only by the width corresponding to the short edge width of the display panel, there is a problem in that a loss of discarded parts of the raw optical film before processing may be increased in comparison with a case in which the raw optical film roll is provided as a long edge width roll by slitting the raw optical film before processing only by a width corresponding to a long edge width of the display panel.

[Summary]

The present invention has been made in an effort to provide a system and a method for manufacturing an optical display element which are capable of manufacturing an organic light emitting optical display element through a single manufacturing line regardless of types of widths of raw optical film rolls to be provided and/or types of widths of organic light emitting display panels to be supplied when manufacturing the organic light emitting optical display element.

An exemplary embodiment according to one aspect of the present invention provides a system for manufacturing an optical display element by laminating an optical film on one surface of a rectangular organic light emitting display panel, the system including: a panel supply unit to which an organic light emitting display panel is supplied; a panel conveying unit which conveys the supplied organic light emitting display panel; an optical film supply unit which supplies an optical film by unwinding the optical film from a raw optical film roll; a laminating unit which laminates the optical film on one surface of the organic light emitting display panel; and a turning unit which rotates the organic light emitting display panel by 90° at least before the optical film is laminated on one surface of the organic light emitting display panel when a width-directional edge of the organic light emitting display panel supplied to the panel supply unit does not correspond to a width of the raw optical film roll.

In the present exemplary embodiment, the raw optical film roll may be provided as one of n (n is an integer greater than 0) raw optical films after processing which are formed by slitting the raw optical film before processing in a longitudinal direction by a predetermined width, and a slitting width may be determined as a width corresponding to an edge having a smaller remainder after dividing a width of the raw optical film before processing by a length of a long edge and a length of a short edge of the organic light emitting display panel and deriving integer quotients.

In the present exemplary embodiment, there may be multiple types of organic light emitting display panels classified based on sizes thereof, and the slitting width may be variably determined based on the size of the organic light emitting display panel.

In the present exemplary embodiment, the organic light emitting display panel may be supplied to the panel supply unit so that the width-directional edge of the organic light emitting display panel becomes a short edge between a long edge and the short edge.

In the present exemplary embodiment, the system may include an auxiliary turning unit which rotates the organic light emitting display panel by 90° after the optical film is laminated on one surface of the organic light emitting display panel when the organic light emitting display panel has been rotated by the turning unit.

In the present exemplary embodiment, the system may include an inspection unit which is disposed at a downstream side of the auxiliary turning unit and optically inspects the organic light emitting display panel, in which the inspection unit includes multiple image capturing devices arranged in a width direction of the organic light emitting display panel.

An exemplary embodiment according to another aspect of the present invention provides a method of manufacturing an optical display element by laminating an optical film on one surface of a rectangular organic light emitting display panel, the method comprising: a panel supply step of supplying an organic light emitting display panel; a panel conveying step of conveying the supplied organic light emitting display panel; an optical film supply step of supplying an optical film by unwinding the optical film from a raw optical film roll; a laminating step of laminating the optical film on one surface of the organic light emitting display panel; and a turning step of rotating the organic light emitting display panel by 90° at least before the optical film is laminated on one surface of the organic light emitting display panel when a width-directional edge of the organic light emitting display panel supplied in the panel supply step does not correspond to a width of the raw optical film roll.

In the present exemplary embodiment, the method may include preparing the raw optical film roll before the optical film supply step, in which the preparing of the raw optical film roll prepares, as the raw optical film roll, one of n (n is an integer greater than 1) raw optical films after processing formed by slitting the raw optical film before processing in a longitudinal direction by a predetermined width, and a slitting width is determined as a width corresponding to an edge having a smaller remainder after dividing a width of the raw optical film before processing by a length of a long edge and a length of a short edge of the organic light emitting display panel and deriving integer quotients.

In the present exemplary embodiment, there may be multiple types of organic light emitting display panels classified based on sizes thereof, and the slitting width may be variably determined based on the size of the organic light emitting display panel.

In the present exemplary embodiment, in the panel supply step, the organic light emitting display panel may be supplied so that the width-directional edge of the organic light emitting display panel becomes a short edge between a long edge and the short edge.

In the present exemplary embodiment, the method may include an auxiliary turning step of rotating, by an auxiliary turning unit, the organic light emitting display panel by 90° after the optical film is laminated on one surface of the organic light emitting display panel when the organic light emitting display panel has been rotated in the turning step.

In the present exemplary embodiment, the method may include an inspection step of optically inspecting the organic light emitting display panel by an inspection unit positioned at a downstream side of the auxiliary turning unit, in which the inspection unit includes multiple image capturing devices arranged in a width direction of the organic light emitting display panel.

According to the exemplary embodiment of the present invention, it is possible to manufacture the organic light emitting optical display element through a single manufacturing line even though types of widths of raw optical film rolls to be provided and/or types of widths of organic light emitting display panels to be supplied are variously changed when manufacturing the organic light emitting optical display element.

DETAILED DESCRIPTION

The present invention will be apparent with reference to exemplary embodiments to be described below in detail together with the accompanying drawings. However, the present invention is not limited to the exemplary embodiments disclosed herein but will be implemented in various forms. The exemplary embodiments are provided so that the present invention is completely disclosed, and a person with ordinary skill in the art can fully understand the scope of the present invention. The present invention will be defined only by the scope of the appended claims. Meanwhile, the terms used in the present specification are for explaining the exemplary embodiments, not for limiting the present invention. Unless particularly stated otherwise in the present specification, a singular form also includes a plural form. The terms such as "comprises (includes)" and/or "comprising (including)" used in the specification do not exclude presence or addition of one or more other constituent elements, steps, operations, and/or elements, in addition to the mentioned constituent elements, steps, operations, and/or elements. The terms such as "first" and "second" may be used to describe various constituent elements, but the constituent elements should not be limited by the terms. These terms are used only to distinguish one constituent element from another constituent element.

Hereinafter, the present invention will be described in detail with reference to the accompanying drawings.

Figure 2A:
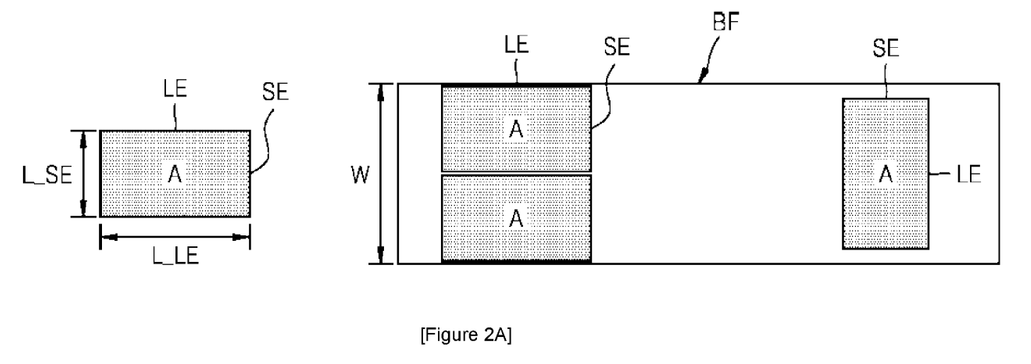
FIGS. 2A and 2B are schematic illustrations of varying widths of raw optical film rolls provided in accordance with varying sizes of organic light emitting display panels.
Figure 2B:
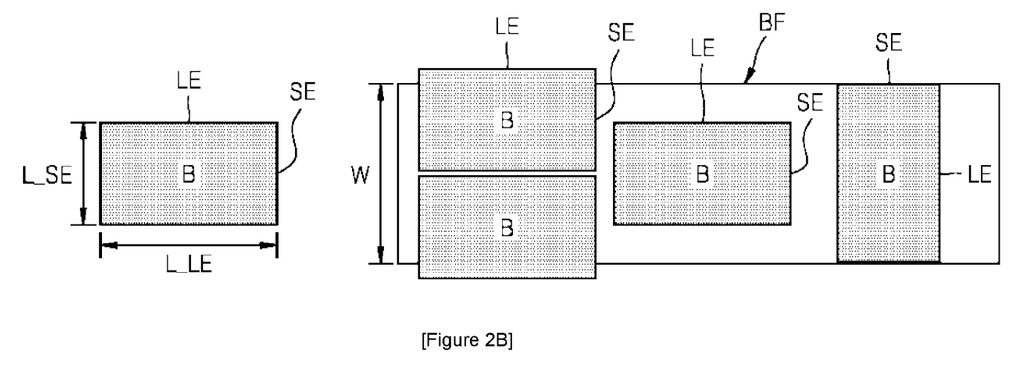

FIGS. 2A and 2B are schematic illustrations of varying widths of raw optical film rolls provided in accordance with varying sizes of organic light emitting display panels.

First, an optical film according to an exemplary embodiment of the present invention may be a stack including a quarter-wave plate and a polarizing plate having a transmission axis in one direction. The optical film may include a release film which is provided on an adhesive layer provided at a lower side of the polarizing plate to protect the adhesive layer.

The raw optical film roll may be provided as one of n (n is an integer greater than 0) raw optical films after processing formed by slitting a raw optical film BF, which has a large width before processing, by a predetermined width in a longitudinal direction.

Meanwhile, to maximize efficiency of usage area of the raw optical film BF before processing a slitting width may be determined as a width which corresponds to an edge having a smaller remainder when deriving an integer quotient by dividing a width W of the raw optical film BF before processing by a long edge and a short edge of an organic light emitting display panel. Here, the integer quotient is derived as an integer greater than 0.

The following two examples will be described.

1) It is assumed that the width W of the raw optical film BF before processing is 1,470 mm, a size of the organic light emitting display panel is 55 inches, a length L_LE of a long edge LE is 1,226.6 mm, and a length L_SE of a short edge SE is 700.8 mm. Here, an integer quotient derived by calculating W/L_LE is 1, and a remainder is 243.4. Further, an integer quotient derived by calculating W/L_SE is 2, and a remainder is 68.4. Therefore, the slitting width may be determined as a width corresponding to the short edge SE having the smaller remainder. That is, in a case in which a 55-inch organic light emitting display panel A is disposed on the raw optical film BF before processing, the two organic light emitting display panels may be disposed when the short edge SE is set to the width direction, and the one organic light emitting display panel may be disposed when the long edge LE is set to the width direction, as illustrated in FIG. 2A. In this case, because a margin in the width direction becomes smaller when the short edge SE is set to the width direction, the slitting width may be determined as the width corresponding to the short edge SE for the purpose of efficiency. The raw optical film roll, which is made by winding, in the form of a roll, the n raw optical films after processing which are slit to have the width corresponding to the short edge SE of the organic light emitting display panel, is referred to as a 'short edge width roll' hereinafter.

2) It is assumed that the width W of the raw optical film BF before processing is 1,470 mm, the size of the organic light emitting display panel is 65 inches, the length L_LE of the long edge LE is 1,447.48 mm, and the length L_SE of the short edge SE is 824.92 mm. Here, an integer quotient derived by calculating W/L_LE is 1, and a remainder is 22.52. Further, an integer quotient derived by calculating W/L_SE is 1, and a remainder is 645.08. Therefore, the slitting width may be determined as a width corresponding to the long edge LE having the smaller remainder. That is, in a case in which a 65-inch organic light emitting display panel B is disposed on the raw optical film BF before processing, the one organic light emitting display panel may be disposed even when the short edge SE is set to the width direction, and the one organic light emitting display panel may be disposed even when the long edge LE is set to the width direction, as illustrated in FIG. 2B. In this case, because a margin in the width direction becomes smaller when the long edge LE is set to the width direction, the slitting width may be determined as the width corresponding to the long edge LE for the purpose of efficiency. The raw optical film roll, which is made by winding, in the form of a roll, the n raw optical films after processing which are slit to have the width corresponding to the long edge LE of the organic light emitting display panel, is referred to as a 'long edge width roll' hereinafter.

Here, the short edge width roll and the long edge width roll may have the transmission axis PA in the direction relatively identical to the longitudinal direction of the raw optical film.

Figure 3:
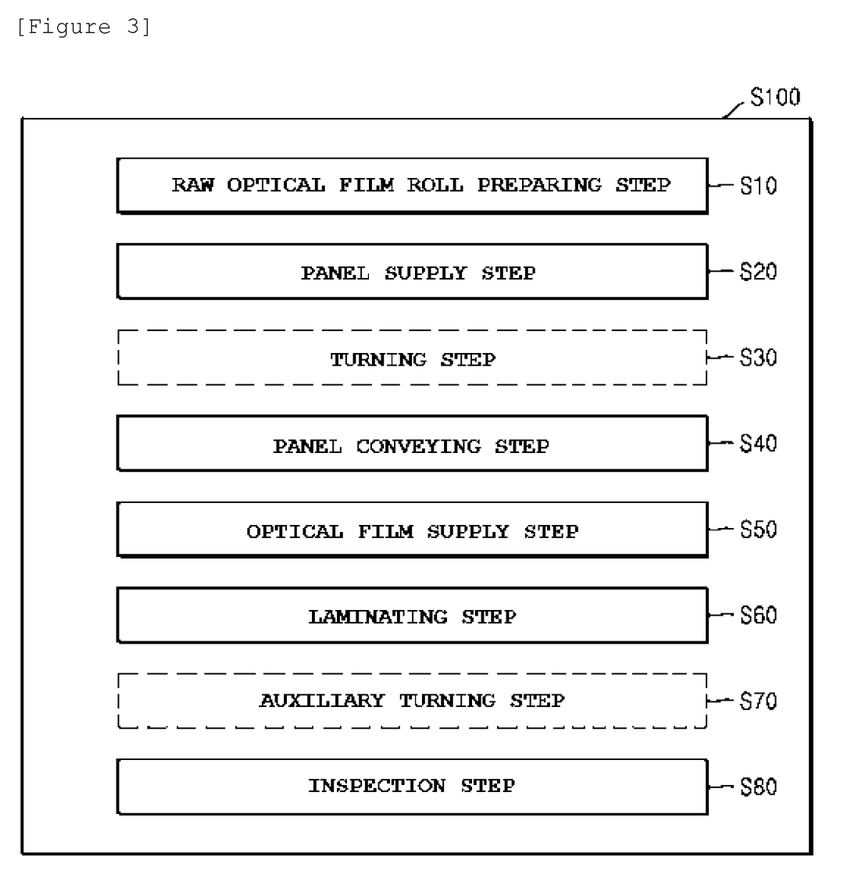
FIG. 3 is a block diagram illustrating a method of manufacturing an optical display element according to an exemplary embodiment of the present invention.
Figure 4:
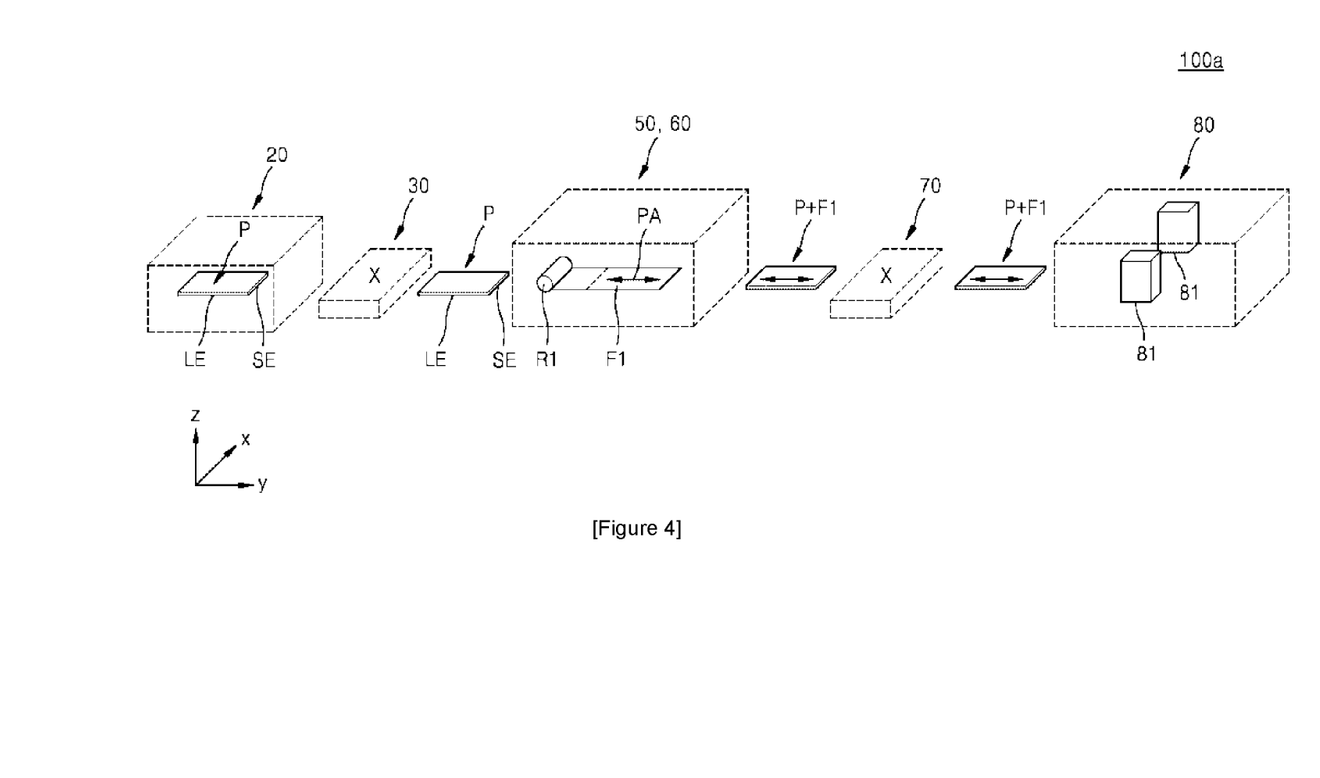
FIG. 4 is a perspective view of an exemplary embodiment in which an optical display element is manufactured by using a system for manufacturing an optical display element when the raw optical film roll is provided as a short edge width roll.
Figure 5:
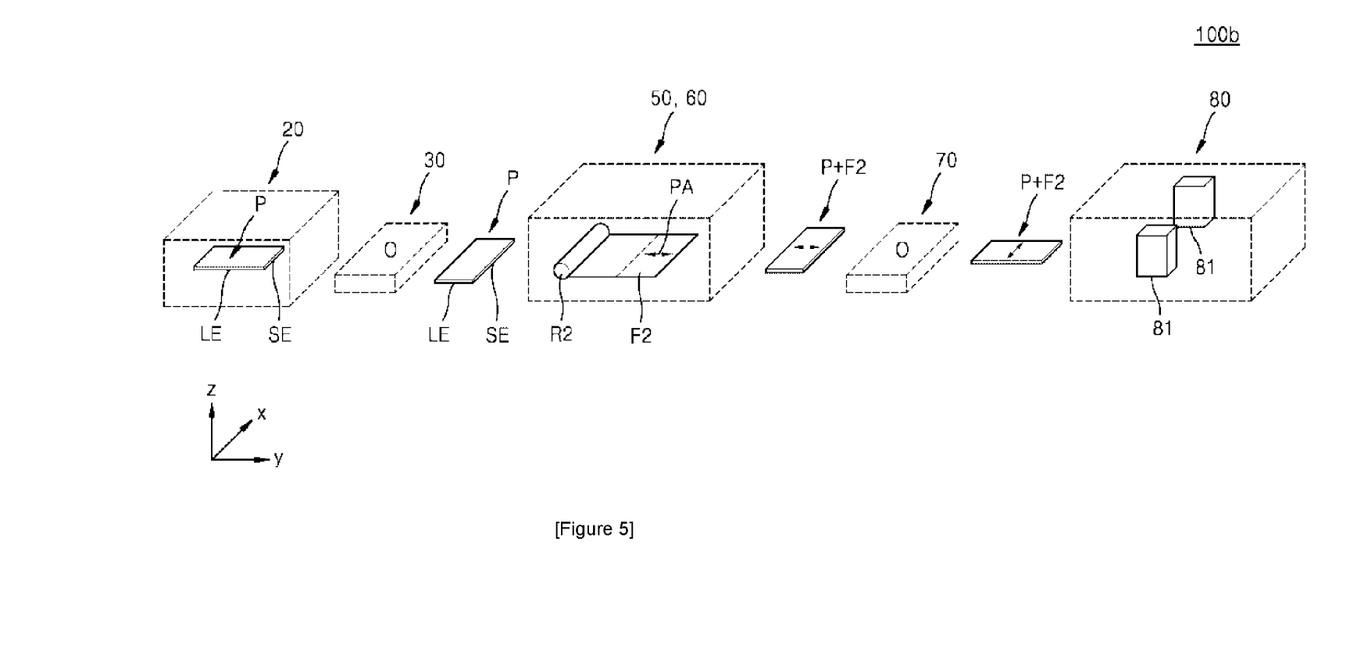
FIG. 5 is a perspective view of an exemplary embodiment in which an optical display element is manufactured by using the system for manufacturing an optical display element when the raw optical film roll is provided as a long edge width roll.

FIG. 3 is a block diagram illustrating a method of manufacturing an optical display element according to an exemplary embodiment of the present invention, FIG. 4 is a perspective view of an exemplary embodiment in which an optical display element is manufactured by using a system for manufacturing an optical display element according when the raw optical film roll is provided as the short edge width roll, and FIG. 5 is a perspective view of an exemplary embodiment in which an optical display element is manufactured by using the system for manufacturing an optical display element when the raw optical film roll is provided as the long edge width roll.

An optical display element manufacturing method S100 according to an exemplary embodiment of the present invention is an optical display element manufacturing method that manufactures an optical display element P+F1 or P+F2 by laminating an optical film F1 or F2 on one surface of a rectangular organic light emitting display panel P. The optical display element manufacturing method may include a panel supply step S20, a turning step S30, a panel conveying step S40, an optical film supply step S50, and a laminating step S60. The optical display element manufacturing method S100 may further include at least one of the auxiliary turning step S70 and the inspection step S80.

In addition, an optical display element manufacturing system 100a or 100b according to the exemplary embodiment of the present invention is an optical display element manufacturing system that manufactures the optical display element P+F1 or P+F2 by laminating the optical film F1 or F2 on one surface of the rectangular organic light emitting display panel P. The optical display element manufacturing system may include a panel supply unit 20, a turning unit 30, a panel conveying unit (not illustrated), an optical film supply unit 50, and a laminating unit 60. The optical display element manufacturing system 100a or 100b may further include an auxiliary turning unit 70 and an inspection unit 80.

The optical display element manufacturing method S100 may further include preparing the raw optical film roll (S10) before the optical film supply step S50.

The preparing of the raw optical film roll (S10) includes preparing, as a raw optical film roll R1 or R2, any one of the n (n is an integer greater than 1) raw optical films after processing, which are formed by slitting the raw optical film BF before processing in the longitudinal direction by a predetermined width. The slitting width may be determined as a width corresponding to an edge having a smaller remainder when dividing the width of the raw optical film BF before processing by the length of the long edge LE and the length of the short edge SE of the organic light emitting display panel P.

Here, there are multiple types A and B of organic light emitting display panels P, which are classified based on the sizes thereof, and the slitting width may be variably determined based on the size of the organic light emitting display panel.

FIG. 4 illustrates the case in which the slitting width is determined as the width corresponding to the short edge SE of the organic light emitting display panel P and the raw optical film roll is provided as the short edge width roll R1. FIG. 5 illustrates the case in which the slitting width is determined as the width corresponding to the long edge LE of the organic light emitting display panel P and the raw optical film roll is provided as the long edge width roll R2.

In the panel supply step S20, the organic light emitting display panel P may be supplied to the panel supply unit 20 which is a section to which the organic light emitting display panel P is supplied from the outside. The organic light emitting display panel P may be supplied to the panel supply unit 20 so that the edge of the organic light emitting display panel P in the width direction (x-axis direction based on the drawings) corresponds to the short edge SE between the long edge LE and the short edge SE.

The turning step S30 may rotate, by the turning unit 30 and by 90°, the organic light emitting display panel P at least before the optical film is laminated on one surface of the organic light emitting display panel P when the width-directional edge of the organic light emitting display panel P supplied to the panel supply unit 20 does not correspond to the width of the raw optical film roll. Here, the rotation of the organic light emitting display panel P by 90° means that the organic light emitting display panel P is rotated so that a positional relationship between the long edge LE and the short edge SE may be reversed.

As illustrated in FIG. 4, because the width-directional edge of the organic light emitting display panel P is the short edge SE and corresponds to the width of the short edge width roll R1 when the provided raw optical film roll is the short edge width roll R1, the turning unit 30 does not turn the organic light emitting display panel P.

In contrast, as illustrated in FIG. 5, because the width-directional edge of the organic light emitting display panel P is the short edge SE and does not correspond to the width of the long edge width roll R2 when the provided raw optical film roll is the long edge width roll R2, the turning unit 30 turns the organic light emitting display panel P.

The panel conveying step S40 may convey, by the panel conveying unit (not illustrated), the organic light emitting display panel P supplied to the panel supply unit 20 in order of the laminating unit 60, the auxiliary turning unit 70, and the inspection unit 80. A conveyor belt, multiple conveying rollers, a manipulator, or the like may be used as the panel conveying unit, but the present invention is not limited thereto, and any means may be used as long as the means may convey the panel.

The optical film supply step S50 may supply, by the optical film supply unit 50, the optical film from the raw optical film roll. During the process of supplying the optical film, the optical film may be cut before the optical film is laminated on the panel so that multiple sheet pieces each having a predetermined interval and a predetermined length may be supplied. In this case, half-cutting, which does not cut a release film when cutting the optical film, may be used so that the release film may serve as a carrier for continuously conveying the sheet pieces of the optical film.

The laminating step S60 may laminate the optical film on one surface of the organic light emitting display panel P by using the laminating unit 60. A pair of compression rollers, a drum having a suction means capable of holding the optical film and then laminating the optical film on a display panel, or the like may be used as the laminating unit 60. Meanwhile, the optical film F1 on the short edge width roll R1 and the optical film F2 on the long edge width roll R2 have the same transmission axis direction PA in the longitudinal direction. However, as illustrated in FIGS. 4 and 5, based on whether the organic light emitting display panel is turned, the transmission axis directions PA are perpendicular to each other instead of being equal to each other based on the longitudinal direction of the long edge or the short edge of the organic light emitting display panel.

In the case in which the organic light emitting display panel P has been rotated by the turning unit 30, the auxiliary turning step S70 may rotate, by the auxiliary turning unit 70 and by 90°, the organic light emitting display panel after the optical film is laminated on one surface of the organic light emitting display panel P.

As illustrated in FIG. 4, if the organic light emitting display panel P has not been rotated by the turning unit 30, the auxiliary turning unit 70 does not rotate the organic light emitting display panel P.

In contrast, as illustrated in FIG. 5, if the organic light emitting display panel P has been rotated by the turning unit 30, the auxiliary turning unit 70 rotates the organic light emitting display panel P.

The inspection step S80 optically inspects the organic light emitting display panel P+F1 or P+F2, to which the optical film is attached, by the inspection unit 80 positioned at a downstream side of the auxiliary turning unit 70. The inspection unit 80 may include multiple image capturing devices 81 arranged in the width direction (x-axis direction based on the drawings) of the organic light emitting display panel. According to the exemplary embodiment of the present invention, since the short edge SE of the organic light emitting display panel P+F1 or P+F2, which is conveyed via the auxiliary turning unit 70, is set to the width direction regardless of types of provided raw optical film rolls, it is not necessary to dispose the image capturing devices 81 along a length corresponding to the long edge LE which is equal to or greater than a length corresponding to the short edge SE of the organic light emitting display panel.

According to the method and/or the system for manufacturing an optical display element according to the exemplary embodiment of the present invention, the organic light emitting display panel may be rotated by 90° when the width-directional edge of the organic light emitting display panel supplied to the panel supply unit does not correspond to the width of the raw optical film roll, and as a result, it is possible to manufacture the organic light emitting optical display elements having various sizes through a single manufacturing line regardless of types of widths of provided raw optical film rolls and/or types of widths of supplied organic light emitting display panels.

While the present invention has been described with reference to the aforementioned exemplary embodiments, various modifications or alterations may be made without departing from the subject matter and the scope of the invention. Accordingly, the appended claims include the modifications or alterations as long as the modifications or alterations fall within the subject matter of the present invention.

REFERENCE NUMERALS AND SYMBOLS USED HEREIN

100a, 100b: Optical display element manufacturing system

20: Panel supply unit
30: Turning unit
50: Optical film supply unit
60: Laminating unit
70: Auxiliary turning unit
80: Inspection unit
P: Organic light emitting display panel
SE: Short edge
LE: Long edge

The invention claimed is:

1. A method of manufacturing an optical display element by laminating an optical film on a surface of a rectangular organic light emitting display panel, the method comprising:
   supplying an organic light emitting display panel;
   conveying the organic light emitting display panel;
   preparing a plurality of raw optical film rolls by slitting a raw optical film in a longitudinal direction by a predetermined slitting width before processing to form n raw optical films, wherein n is an integer greater than 1, and wherein the slitting width is a width corresponding to an edge having a smaller remainder after dividing a width of the raw optical film before processing by a length of a long edge and a length of a short edge of the organic light emitting display panel and deriving integer quotients thereof;
   supplying an optical film by unwinding the optical film from one of the raw optical film rolls;
   laminating the optical film on the surface of the organic light emitting display panel; and
   rotating the organic light emitting display panel by 90° when a width-directional edge of the organic light emitting display panel as supplied does not correspond to a width of the one of the raw optical film rolls before the optical film is laminated on one surface of the organic light emitting display panel.

2. The method of claim 1, wherein a plurality of organic light emitting display panels are classified based on sizes thereof, and the slitting width is variably determined based on the size of each of the plurality of organic light emitting display panels.

3. The method of claim 1, wherein the organic light emitting display panel is supplied such that the width-directional edge of the organic light emitting display panel is a short edge of the organic light emitting display panel.

4. The method of claim 1, further comprising:
   rotating the organic light emitting display panel by 90° after the optical film is laminated on the surface of the organic light emitting display panel when the organic light emitting display panel has been rotated before the optical film was laminated on one surface of the organic light emitting display panel.

5. The method of claim 4, further comprising:
   using a plurality of image capturing devices arranged in a width direction of the organic light emitting display panel to optically inspect the organic light emitting display panel to which the optical film is laminated.

* * * * *